United States Patent [19]

Kurek

[11] 4,207,665
[45] Jun. 17, 1980

[54] PIN EXTRACTOR FOR INTEGRATED CIRCUIT TUBE

[76] Inventor: Harry F. Kurek, 650 Taylor, Sunnyvale, Calif. 94086

[21] Appl. No.: 948,924

[22] Filed: Oct. 5, 1978

[51] Int. Cl.² ............................................. B25B 27/00
[52] U.S. Cl. ......................................... 29/270; 29/764
[58] Field of Search ................. 29/270, 278, 253, 275, 29/276, 280, 764, 762; 145/46

[56] References Cited

U.S. PATENT DOCUMENTS

| | | | |
|---|---|---|---|
| 2,736,088 | 2/1956 | Thygeson | 29/270 |
| 3,584,525 | 6/1971 | Caveney | 29/270 |
| 3,602,969 | 9/1971 | Provost | 29/275 |
| 3,689,977 | 9/1972 | Crabbe | 29/280 |

*Primary Examiner*—James L. Jones, Jr.
*Attorney, Agent, or Firm*—Townsend and Townsend

[57] ABSTRACT

A device for dislodging pins from storage tubes for dual-in-line-type integrated circuit packages comprises a cylinder which conforms generally to the outside dimensions of the storage tube and which has a fin of varied height for engaging one end of the pin and a claw portion for engaging the opposing end of the pin. In operation the cylinder is slid along the tube where it engages a pin and upon further movement of the device along the tube extracts the pin transversely of the device movement.

5 Claims, 5 Drawing Figures

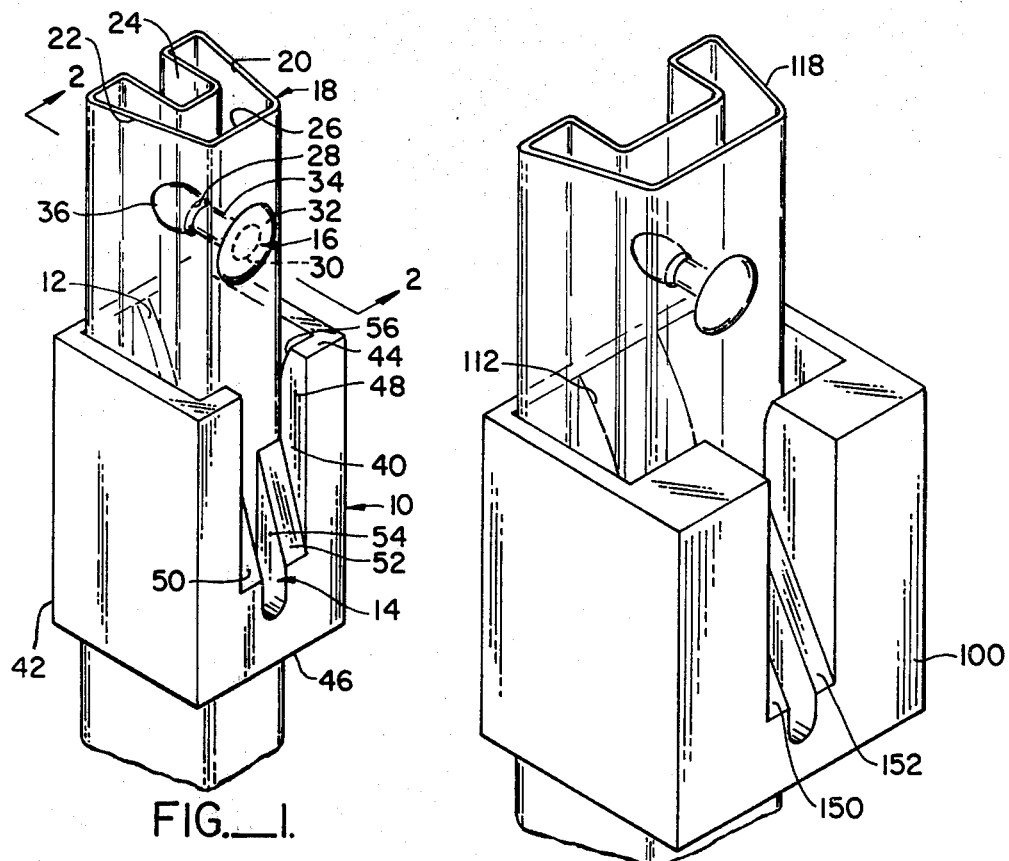
FIG. 1.
FIG. 3.
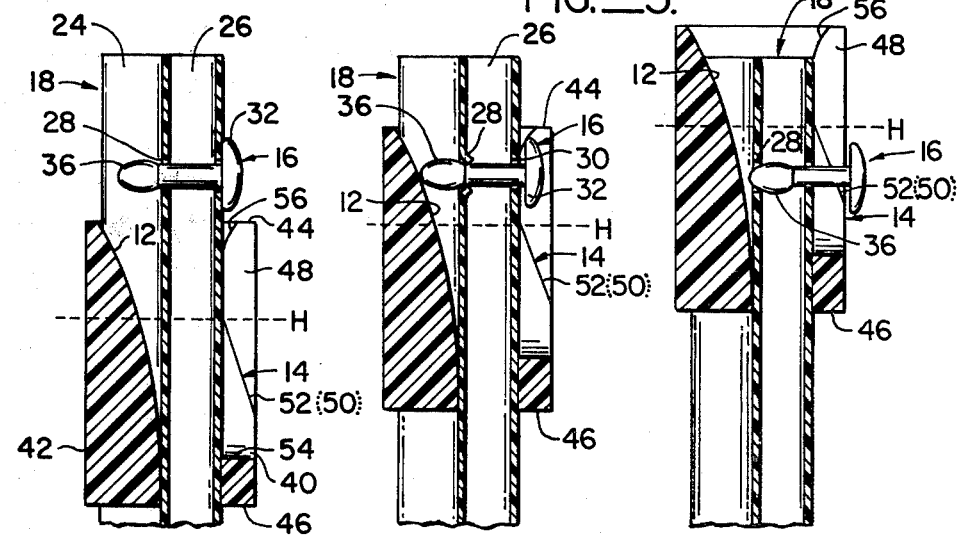
FIG. 2A.
FIG. 2B.
FIG. 2C.

PIN EXTRACTOR FOR INTEGRATED CIRCUIT TUBE

BACKGROUND OF THE INVENTION

1. Field of the Invention

This invention relates to a device for dislodging a retaining pin, and particularly for pulling a molded pin from an end portion of a storage tube adapted for carrying dual-in-line package (DIP) integrated circuits (ICs) which are aligned end to end therein.

DIP-type ICs are generally packaged for storage and transportation in hollow tubular plastic containers or tubes having a U-shaped cross-section. The plastic tubes have aligned holes through an end portion to receive a retaining pin. The retaining pin is a shaft generally of a hard plastic material having a cap at one end and at the other end a bulbous tip of a circumference sufficiently large to snap through the aligned holes. The shaft length between the bulbous tip and the cap is sufficiently long to span the hollow space within the tube when the pin is inserted through the aligned holes.

2. Description of the Prior Art

Although the above storage technique is the accepted means for storing and transporting integrated circuit devices, the retaining pins are somewhat inconvenient and difficult to remove. Typically, the pins are removed by pulling them out of the holes with a pair of pliers. Alternatively, nippers may be used to cut the cap off to allow the pin to fall through the tube holes. These techniques of pin removal are time consuming, inconvenient, and can damage the integrated circuits of the tubes. What is therefore needed is a simple device for quickly pulling or removing the pins and which will not damage the tubes, the pins or the ICs in the tubes.

SUMMARY OF THE INVENTION

A device for dislodging pins from storage tubes for dual-in-line-type integrated circuit packages comprises a cylinder which conforms generally to the outside dimensions of the storage tube and which has an interior fin of varied height for engaging one end of the pin and a claw portion in an exterior wall for engaging the opposing end of the pin. In operation the cylinder is slid along the tube where it engages a pin and upon further movement of the device along the tube extracts the pin transversely of the device movement.

It is an object of this invention to provide a simple device for dislodging and extracting retaining pins from IC storage tubes. It is a further particular object of the invention to provide a device for extracting retaining pins with a minimum of user motion.

It is a still further object of the invention to provide a device to extract pins from an IC storage tube which minimizes the risk of damage to the pin, the storage tube and to the ICs stored in the storage tube.

Other objects and advantages of this invention will be apparent by reference to the following detailed description taken in conjunction with the accompanying drawings.

BRIEF DESCRIPTION OF THE DRAWINGS

FIG. 1 is a perspective view of a first embodiment of the invention.

FIG. 2A is a side cross-sectional view of the invention showing it in a first postion with respect to a retaining pin.

FIG. 2B is a side cross-sectional view of a device according to the invention showing it in a second position relative to a retaining pin.

FIG. 2C is a side cross-sectional view of a device according to the invention showing it in a third position relative to a retaining pin.

FIG. 3 is a perspective view of a second embodiment of the invention.

DETAILED DESCRIPTION OF PREFERRED EMBODIMENTS

The principal features of the invention are illustrated in FIG. 1. The device according to the invention comprises a body 10 having a fin 12, and a claw 14. The shape and relative positioning of these three features determine the operation of the invention, the object of which is to extract a retaining pin 16 from a U-shaped IC storage tube 18, as shown.

The device according to the invention is specifically for use with IC storage tubes 18 of a particular shape and cross section. The storage tube 18 comprises a channel or channel means having two lateral sections 20 and 22 generally separated by a trough portion 24 and joined at a central section 26, thereby defining a U-shape in cross section. The lateral sections 20, 22 are adapted to provide space for the terminal pins of a dual-in-line-package for an integrated circuit, commonly known as a DIP IC (not shown). The central section 26 is adapted to accommodate the body of the DIP IC. ICs are stored end to end within the storage tube 18. The retaining pin 16 is employed for blocking the ends of the storage tube 18, and thus ICs stored within the storage tube 18.

To accommodate the retaining pin 16, wall portions of the storage tube 18 across the central section 26 are provided with first and second aligned holes 28 and 30. The retaining pin 16 is adapted to interlock with these holes 28, 30. In particular, the retaining pin 16 comprises a cap 32, a shaft 34, and a bulbous tip 36. The shaft 34 is sufficient to span the central section 26 between opposing walls. The bulbous tip 36 is of sufficient diameter to resist insertion of the tip 36 through the holes 28, 30. However, the storage tube 18 is constructed of a material which is characterized by its flexibility and resilience. In particular, the storage tube wall is sufficiently flexible to permit deformation of the holes 28 and 30 such that the bulbous tip 36 can be inserted therethrough. In addition, the storage tube 18 material is sufficiently resilient to substantially recover its original shape after penetration by the bulbous tip 36. It is in this environment that the invention is designed to operate.

Referring to FIGS. 2A, 2B and 2C in conjunction with FIG. 1, the important features of the invention are explained in greater detail.

The body 10 comprises opposing body walls 40, 42. The body walls 40, 42 are generally fixedly spaced from and parallel to one another, the spacing being determined by the depth of the storage tube 18. In particular, the body wall spacing is sufficient to permit a storage tube 18 to be slid longitudinally between the body walls 40, 42. The body 10 includes a first end or front end 44 and a second and/or back end 46. Where the body 10 forms a cylinder which encompasses storage tube 18, the front end 44 is an entrance for the storage tube 18 and the back end 46 is an exit for the storage tube 18.

The fin 12 is in longitudinal alignment from the front end 44 to the back end 46, and it extends from the body wall 42 toward the body wall 40. The width of fin 12 is less than the width of the trough portion 24 such that the outer margin of the storage tube 18 approximately mates with the inner margin of the body 10 including the maximum height of fin 12. Fin 12 is varied in height from a minimum adjacent the front end 44, as most clearly shown in FIGS. 2A, 2B, and 2C, to a maximum toward the back end 46. In this position, any portion of the bulbous tip 36 which protrudes into the trough portion 24 will eventually encounter the fin 12 as the storage tube 18 is slid longitudinally with respect to the body 10.

Body wall 40 further defines a claw 14 which is adapted to engage the cap 32 of retaining pin 16. For this purpose, body wall 40 includes a first slot opening 48 along the longitudinal axis of the body 10, slot 48 being at least as wide as the cap 32. Slot 48 terminates at front end 44. Within slot 48 are two rails 50, 52 also in alignment with the longitudinal axis of body 10. Rails 50, 52 are separated by a second slot 54, the width of which is less than the diameter of cap 32 but greater than the diameter of shaft 34. The slot 54 is longitudinally aligned with fin 12.

Rails 50, 52 vary in height from a minimum toward the front end 44 to a maximum toward the back end 46. The front end portion of rails 50, 52 are laterally aligned with a point of the fin 12 (labelled H in FIGS. 2A, 2B and 2C) which corresponds to a point where the bulbous tip 36 of pin 16 would be expected to have encountered fin 12 upon longitudinal displacement of fin 12. This assures that the cap 32 is raised above the surface of the storage tube 18 (FIG. 2B). In this position, the rails 50, 52 can gain a purchase on the cap 32. It should be noted that the slope of the fin 12 in lateral alignment with the rails 50, 52 is approximately the same as the slope of the rails 50, 52, FIG. 2A, FIG. 2B, and FIG. 2C being drawn approximately to scale.

In operation, the device according to the invention is used as follows: a storage tube 18 having a retaining pin 16 is inserted into the front end 32 of the pin extractor body 10. It will be noted that the inside walls of the body pin adjacent the front end are flared outwardly at a bevel 56 such that the tube 18 can be more easily inserted into the extractor body pin. The tube 18 is moved longitudinally along the extractor body pin until the fin 12 encounters the bulbous tip 36 (FIG. 2A, FIG. 2B). The fin 12 upon encountering the bulbous tip 36 urges the retaining pin 16 laterally. The cap 32 is likewise displaced laterally. Further movement (FIG. 2B, FIG. 2C), causes the hole 28 to deform. With continued longitudinal movement, the fin 12 urges the bulbous tip 36 through hole 28 while the claw 14 draws on the cap 32 through its rails 52 and 50. The combined force of the fin 12 and the claw 14 causes the bulbous tip 36 to pop out of hole 28. Thus dislodged, the pin 16 can be easily removed, for example by hand, from the storage tube 18. The retaining pin does not need to be fully withdrawn immediately from any more than one hole.

Should it be desired to remove the retaining pin quickly and completely from the storage tube 18, then the device according to the invention can be modified as follows. The claw portion 14 can be extended such that the height of the rails 52 at their maximum is greater than the distance between the cap 32 and and the widest portion of the bulbous tip. FIG. 3 shows such an embodiment. The rails 150, 152 are substantially longer in the embodiment of FIG. 3 as compared to the embodiment of FIG. 1. The length of the extractor body 100 is also slightly longer to accommodate the increased lateral displacement of the claws 150, 152. It should be noted also that the storage tube 118 shown in FIG. 3 is of a greater width than the storage tube 18 of FIG. 1. The storage tube 118 is designed to accommodate water ICs, such as microprocessor chips, Read Only Memory (ROM) chips, and other like large packages. For this purpose, the fin 112 is of a greater width as compared to the fin 12 of FIG. 1.

The invention has now been explained with reference to particular embodiments. Other embodiments similar to the ones herein disclosed will be apparent to those of ordinary skill in the art in light of this disclosure. It is therefore not intended that the invention be limited except as indicated by the appended claims.

What is claimed is:

1. For use with channel means for storing dual-in-line-type integrated circuit packages, said channel means comprising a hollow, U-shaped tube having a continuous channel wall defining a cross-sectional portion and first and second lateral cross-sectional portions extending laterally from said central cross-sectional portion to define a trough portion therebetween, said central cross-sectional portion further defining at least one first hole and at least one second hole, said first hole being in said trough portion of said channel wall and said second hole being in an outer channel wall portion aligned with said first hole, a device for dislodging a retaining pin disposed through said holes from said holes, said retaining pin comprising a shaft, a cap at one end of said shaft and a bulbous tip at the opposing end of said shaft, said shaft being of sufficient length and said bulbous tip being of sufficient diameter to fit through both said first and said second holes and to be retained in a position blocking said central cross-sectional portion, said device comprising:

a body;
a fin protruding from said body for engaging said bulbous end; and
means in said body defining a claw portion for engaging said cap adjacent said shaft;
said body comprising a first body wall and a second body wall, said first and second body walls defining a common front end and a common back end, said first body wall being disposed generally parallel with and fixedly spaced from said second body wall, said distance being sufficiently great to slideably receive said channel means longitudinally between said first and second body walls;
said fin being disposed to protrude from said first body wall toward said second body wall in longitudinal alignment from said front end to said back end, said fin being of a width sufficiently small to accommodate the minimum width of said trough portion of said channel means, said fin being varied in height from a minimum adjacent said front end to a maximum toward said back end, said maximum being sufficient to urge said bulbous end toward said first wall upon engagement of said second body wall with said outer channel wall portion in response to longitudinal movement of said channel means;
said claw defining means comprising rails varied in height from a minimum toward said front end to a maximum toward said back end on opposing sides of a slot, said slot being sufficiently wide to accommodate said shaft, and said rails being of sufficient maximum height to effect the withdrawal of said bulbous end through said first hole upon longitudinal displacement of said channel means.

2. A device according to claim 1 wherein said body comprises a cylinder adapted to circumscribe said channel means.

3. A device according to claim 1 wherein said claw defining means is disposed a preselected distance from said front end corresponding to a preselected height of said fin to ensure that said cap is spaced from said outer channel wall portion a preselected distance before engagement between said cap and said rails.

4. For use with a U-shaped channel means adapted for storing dual-in-line type integrated circuit packages having at least one retaining pin at a selected location transversely therethrough, said retaining pin having a first end and a second opposing end, a device for dislodging said retaining pin comprising:

body means adapted to longitudinally engage said channel means;

means connected to said body means for engaging said first end of said retaining pin for urging said retaining pin from a first rest position to a second intermediate position in response to longitudinal movement of said body means;

means spaced a preselected distance from said urging means for engaging said retaining pin adjacent said second end for extracting said pin from said second position to a third dislodged position upon continued longitudinal movement of said body means while said urging means is engaged to said first end of said retaining pin, such that said pin is removed from said channel means.

5. A device according to claim 4 wherein said body means comprises a cylinder adapted to circumscribe said channel means and wherein said urging means comprises a longitudinally disposed fin of varied height.

* * * * *